United States Patent
Zhang

(10) Patent No.: US 8,281,264 B2
(45) Date of Patent: Oct. 2, 2012

(54) MODEL-BASED PATTERN CHARACTERIZATION TO GENERATE RULES FOR RULE-MODEL-BASED HYBRID OPTICAL PROXIMITY CORRECTION

(75) Inventor: Youping Zhang, Fremont, CA (US)

(73) Assignee: Takumi Technology Corporation, Santa Clara, CA (US)

( * ) Notice: Subject to any disclaimer, the term of this patent is extended or adjusted under 35 U.S.C. 154(b) by 290 days.

(21) Appl. No.: 12/592,674

(22) Filed: Dec. 1, 2009

(65) Prior Publication Data

US 2010/0153904 A1 Jun. 17, 2010

Related U.S. Application Data

(62) Division of application No. 11/221,528, filed on Sep. 8, 2005, now Pat. No. 7,627,837.

(60) Provisional application No. 60/619,208, filed on Oct. 15, 2004.

(51) Int. Cl.
*G06F 17/50* (2006.01)
*G06F 9/455* (2006.01)
*G06F 11/22* (2006.01)

(52) U.S. Cl. ............. 716/51; 716/53; 716/132; 716/136

(58) Field of Classification Search .................... 716/51, 716/53, 132, 136
See application file for complete search history.

(56) References Cited

U.S. PATENT DOCUMENTS

2003/0149955 A1* 8/2003 Ohnuma ...................... 716/19

\* cited by examiner

*Primary Examiner* — Suresh Memula
(74) *Attorney, Agent, or Firm* — William C. Milks, III

(57) ABSTRACT

A system and method are provided for analyzing layout patterns via simulation using a lithography model to characterize the patterns and generate rules to be used in rule-based optical proximity correction (OPC). The system and method analyze a series of layout patterns conforming to a set of design rules by simulation using a lithography model to obtain a partition of the pattern spaces into one portion that requires only rule-based OPC and another portion that requires model-based OPC. A corresponding hybrid OPC system and method are also introduced that utilize the generated rules to correct an integrated circuit (IC) design layout which reduces the OPC output complexity and improves turnaround time.

38 Claims, 10 Drawing Sheets

Region of sight and pattern variations

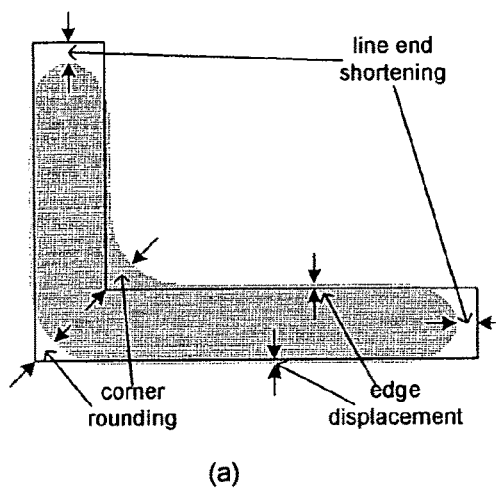
(a)
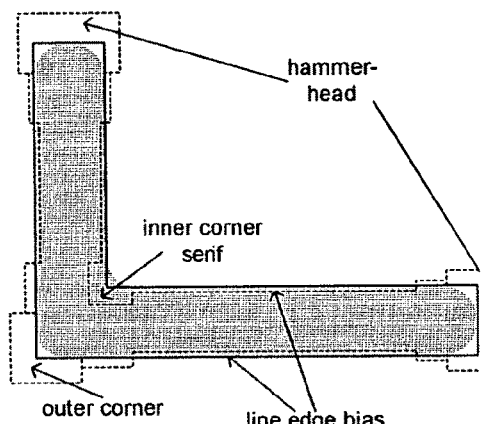
(b)
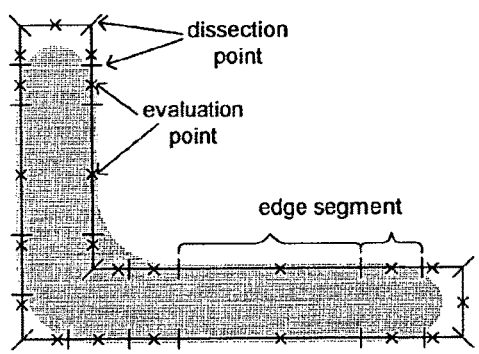
(c)
Figure 1(a)-(c). Pattern Distortion Through Photolithography Process and Optical Proximity Correction (PRIOR ART)

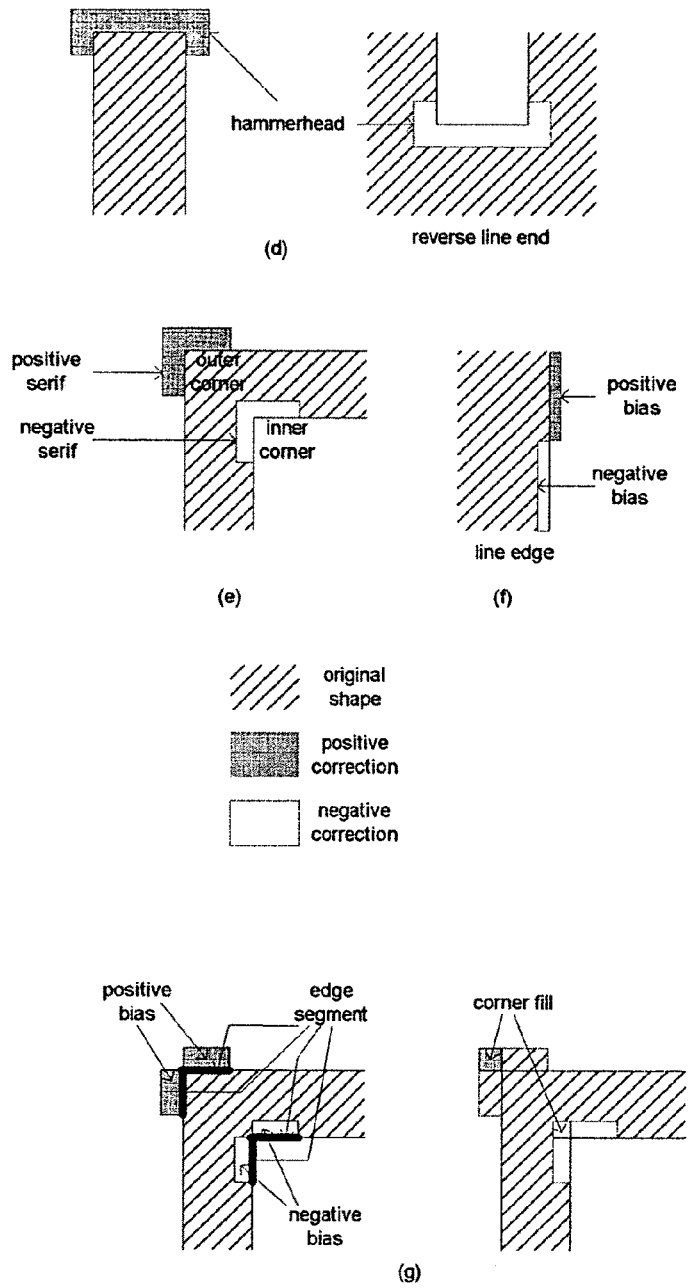
Figure 1(d)-(g). Pattern Distortion Through Photolithography Process and Optical Proximity Correction (PRIOR ART)

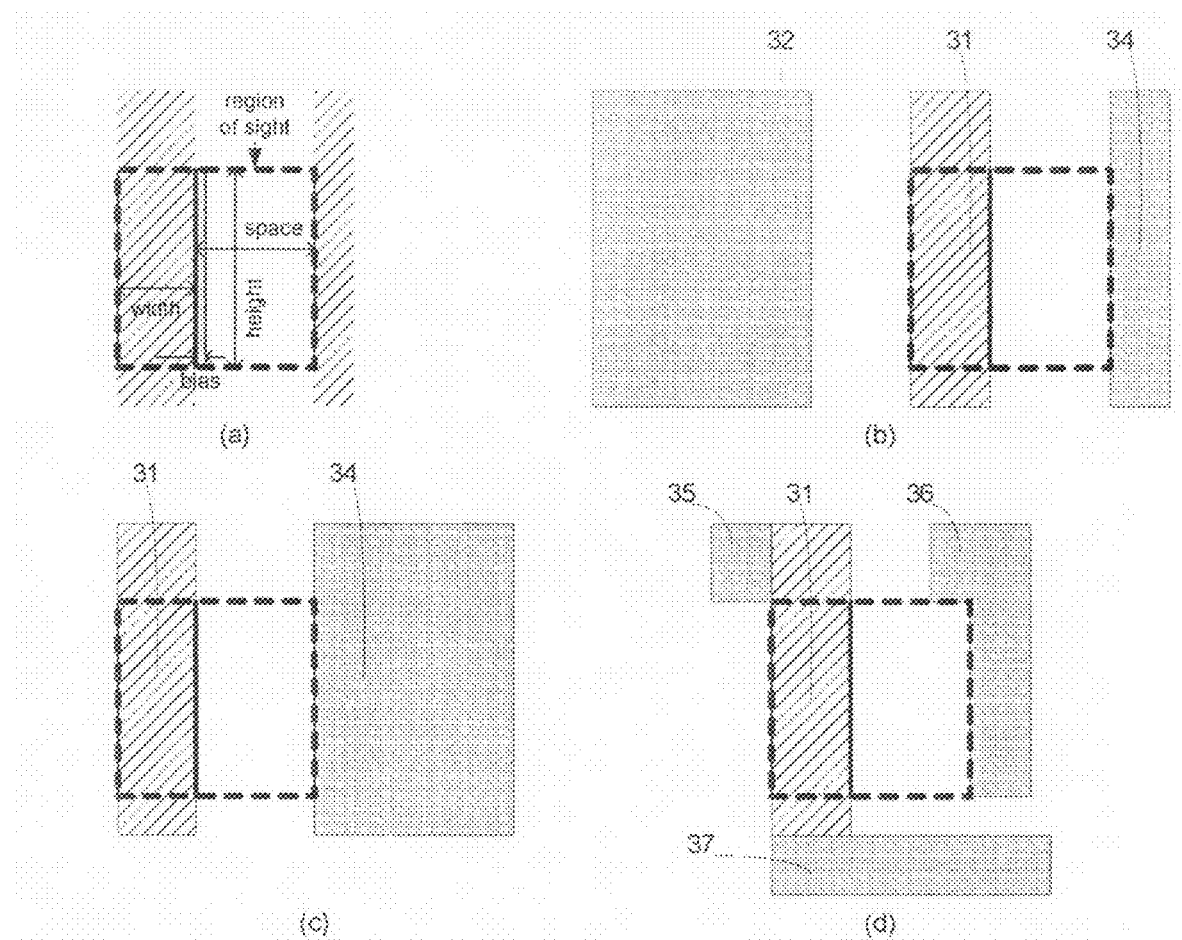
Figure 3. Region of sight and pattern variations

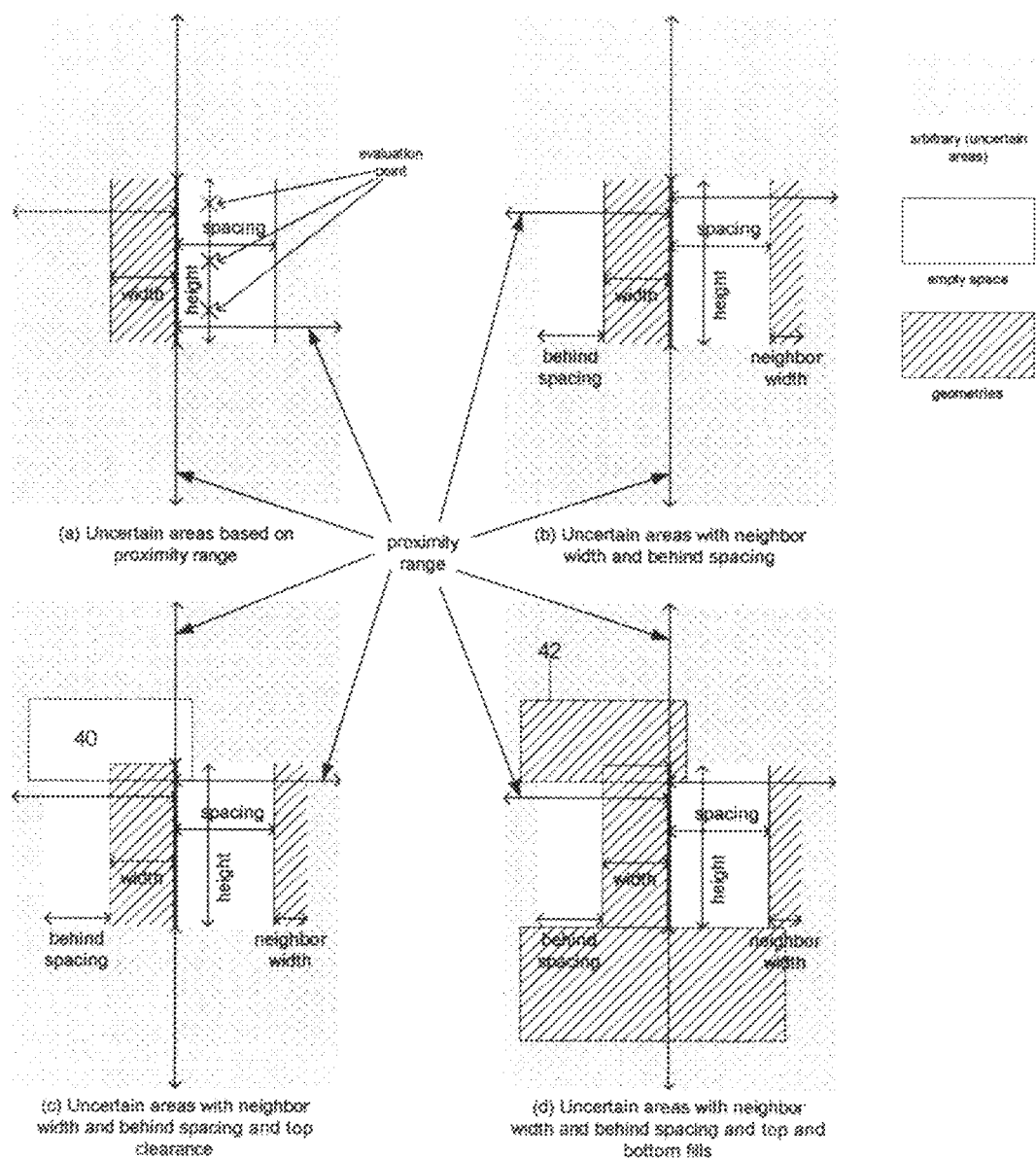
Figure 4. Uncertain Areas and Neighbor Width, Behind Spacing, and Vertical Clearance / Fills

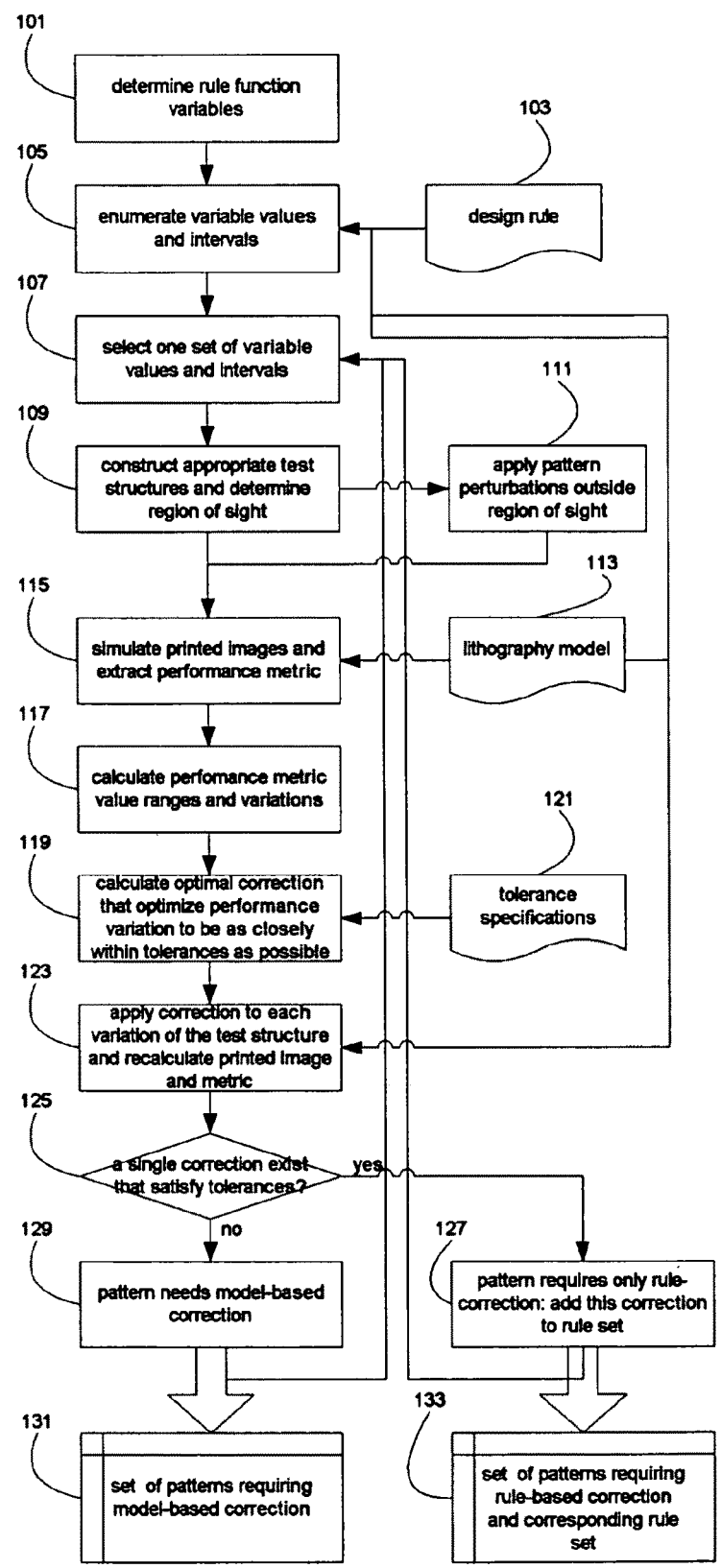
Figure 5. Flow chart of model-based geometry characterization and rule determination

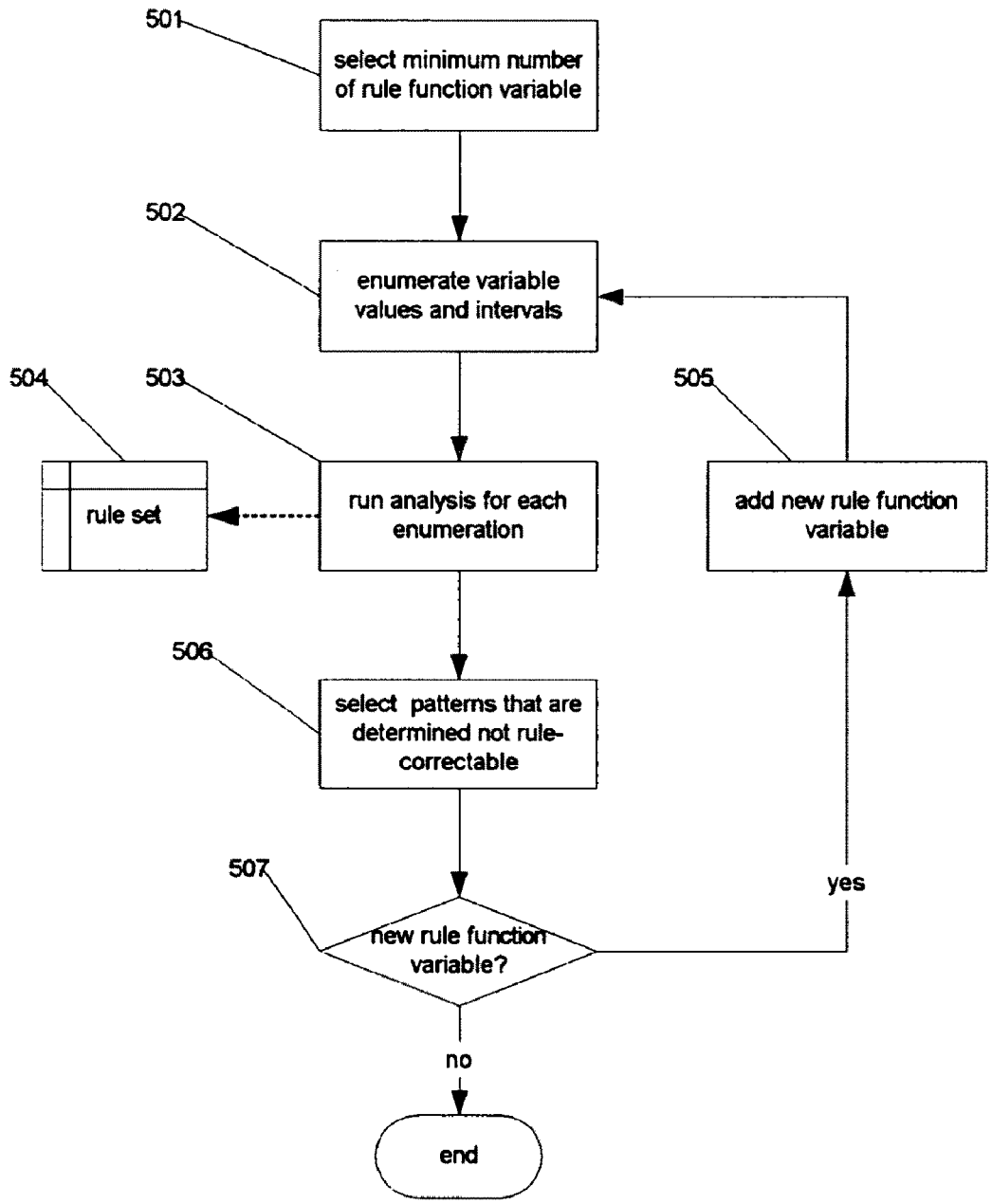
Figure 6. Incremental geometrical characterization and rule creation flow

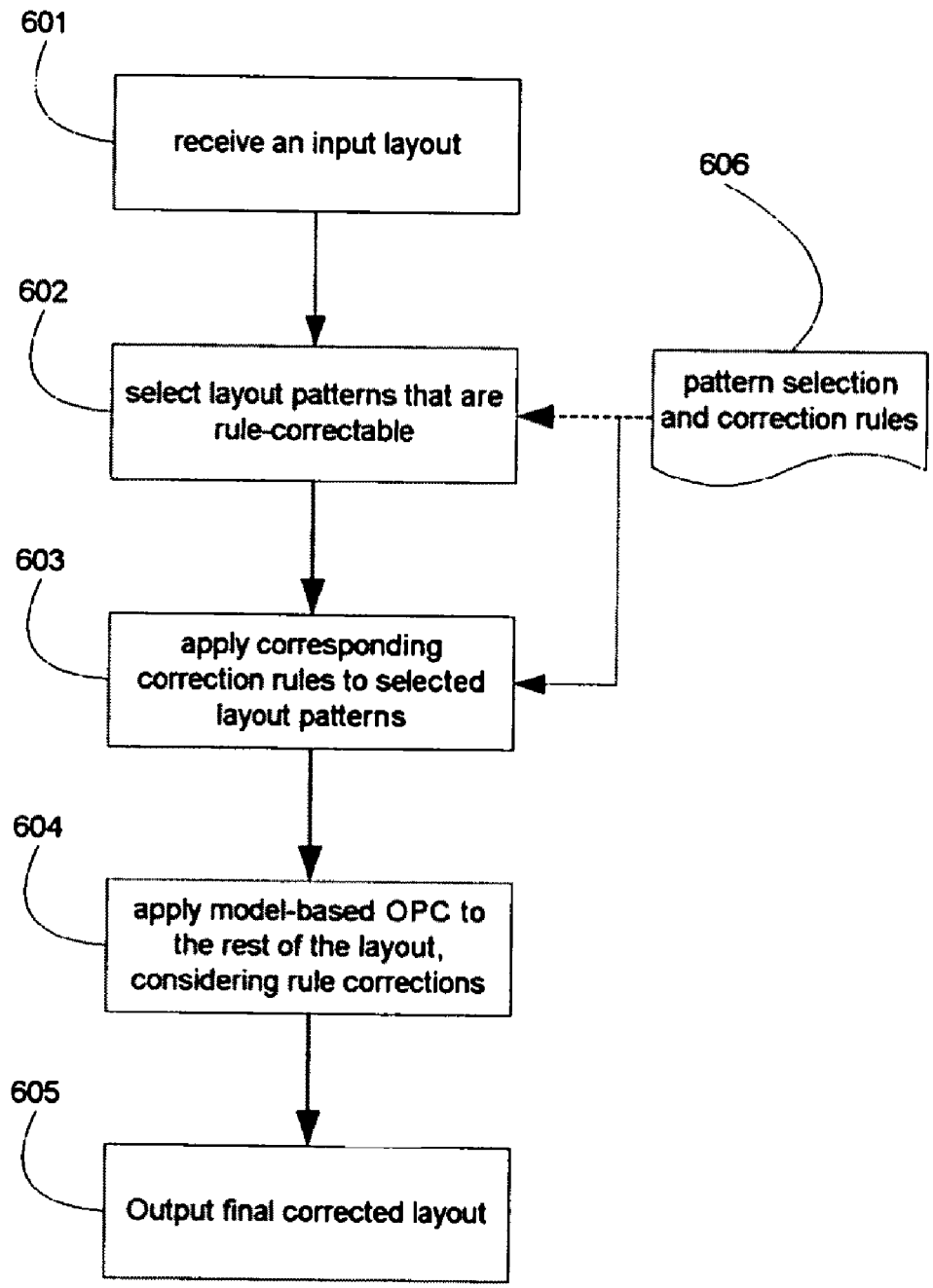
Figure 7. Hybrid OPC Using the Pattern Selection and Correction Rules

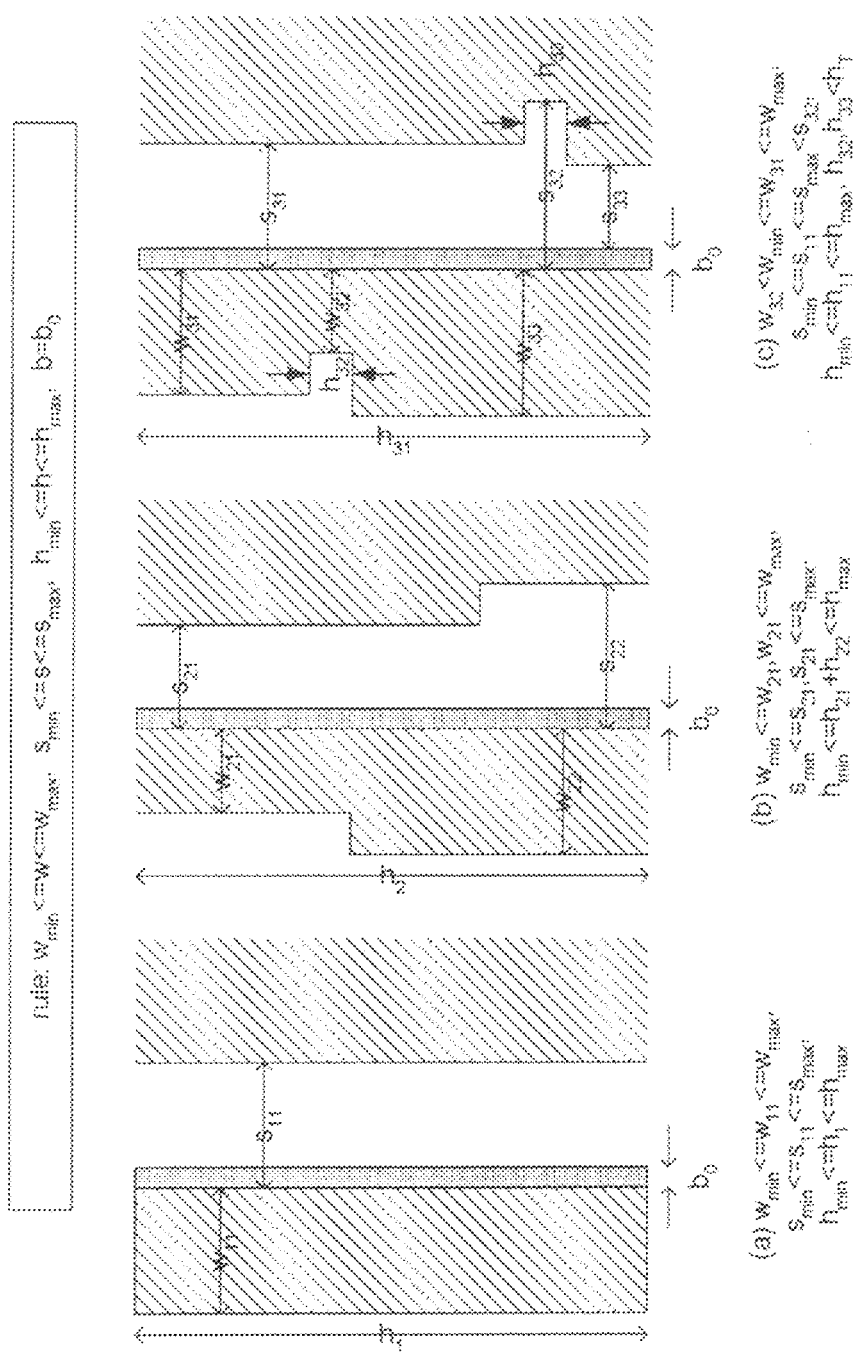
Figure 8(a)-(c). More scenarios of application of selection and correction rules

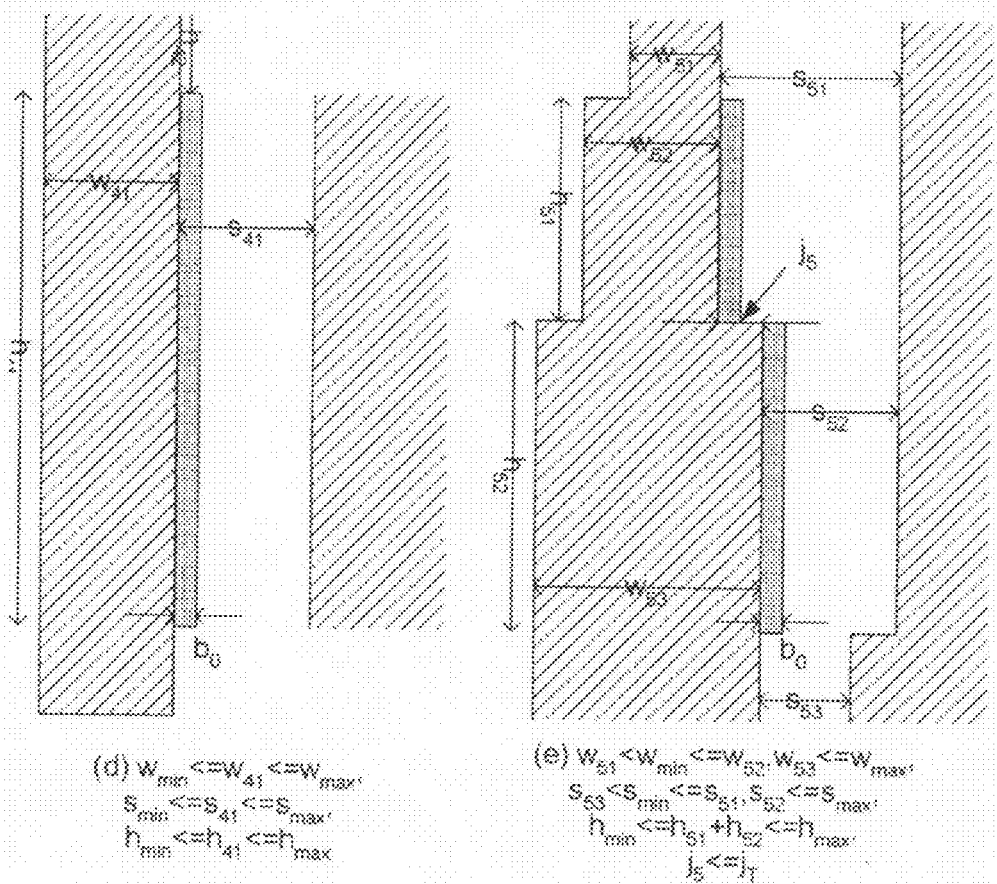
Figure 8(d)-(e). More scenarios of application of selection and correction rules

US 8,281,264 B2

MODEL-BASED PATTERN CHARACTERIZATION TO GENERATE RULES FOR RULE-MODEL-BASED HYBRID OPTICAL PROXIMITY CORRECTION

CROSS-REFERENCE TO RELATED APPLICATIONS

This is a divisional of prior U.S. patent application Ser. No. 11/221,528 filed on Sep. 8, 2005, now U.S. Pat. No. 7,627,837 issued on Dec. 1, 2009.

This application relates to U.S. Provisional Patent Application No. 60/619,208 filed on Oct. 15, 2004 entitled METHOD FOR MODEL BASED GEOMETRICAL CHARACTERIZATION TO GENERATE RULES FOR RULE-MODEL BASED HYBRID OPTICAL PROXIMITY CORRECTION.

BACKGROUND OF THE INVENTION

1. Field of the Invention

The present invention relates generally to a system and method for designing integrated circuits or migrating integrated circuit designs from one technology node to another for fabrication by a semiconductor manufacturing process and, more particularly, to a system and method for providing optical proximity correction for integrated circuit design layouts.

2. Description of the Prior Art

The semiconductor manufacturing industry is continually evolving semiconductor device designs and fabrication processes and developing new processes to produce smaller and smaller geometries of the designs being manufactured. Semiconductor devices constituted by smaller geometries typically consume less power, generate less heat, and operate at higher speeds than those having larger geometries. Moreover, smaller geometries allow silicon chips to contain more circuit elements, and, hence, the integrated circuit (IC) can be more complex, and more copies of the same die can be produced on a single silicon wafer. Currently, a single IC chip may contain over one billion geometries. Consequently, IC designs and semiconductor fabrication processes are extremely complex, since hundreds of processing steps may be involved. Occurrence of a mistake or small error at any of the design or process steps may necessitate redesign or cause lower yield in the final semiconductor product, where yield may be defined as the number of functional devices produced by the process as compared to the theoretical number of devices that could be produced assuming no bad devices.

Improving time-to-market and yield is a critical problem in the semiconductor manufacturing industry and has a direct economic impact on the semiconductor industry. In particular, a reduced time-to-market and higher yield translate into earlier availability and more devices that may be sold by the manufacturer.

IC design layouts consist of a number of geometries in the form of polygons. Polygons are used to construct different features that are composed of portions of or whole polygons that are typically characterized by certain geometric properties such as dimensions. Each feature constitutes one or more shapes that represent one or more edges of a feature. A combination of features adjacent to each other forms a topological configuration that is often referred to as a pattern, or structure. Therefore, the IC layout can also be viewed as constituting a number of repeated patterns, and any number of such patterns constitutes a portion of the IC layout. These patterns of IC layouts are transferred to the silicon wafer predominantly through a process called lithography. In the most commonly used lithographic process referred to as photolithography, a mask or reticle having transparent and opaque regions representing structures in one IC layer is illuminated by a light source. The light emanating from the mask is then focused on a photoresist layer applied to the wafer. Then the wafer is developed to have portions of the resist removed and portions of the wafer etched, forming the geometrical patterns as desired. Typically, for IC designs with large feature dimensions, the patterns on the design are accurately transferred to the mask, and then accurately transferred to the wafer through the lithography process, culminating in a phenomenon commonly referred to as WYSIWYG ("What you see is what you get").

With ever decreasing feature sizes, increasing pattern densities, and difficulty experienced in the advancement of IC manufacturing equipment, manufacturing of modern IC designs has encountered substantial impediments and concomitant yield problems within the near- and sub-wavelength regime, where the feature dimension is at or below the wavelength of the light source. Diffraction-limited imaging in the near- and sub-wavelength regime has caused the classical WYSIWYG paradigm to disappear. With the emergence of near- and sub-wavelength lithography, patterns projected to the wafer through the lithography process are severely distorted. Typical distortions include line edge displacement, which is common for line edge shapes, corner rounding, which is exhibited by corner shapes, and line end shortening, which is experienced with line end shapes, as illustrated in FIG. 1(a).

In view of the widening gap between design and manufacturability in the near- and sub-wavelength regime, the use of optical resolution enhancement techniques (RET) such as optical proximity correction (OPC) is prevalent in many of the design and manufacturing schema to produce feature sizes of 0.18 µm and smaller. Typically, a design tape-out, in the form of, for example, GDSII, is input to the RET implementation, e.g., an OPC data conversion, which generates new GDSII data using the input GDSII design tape-out as a reference.

OPC is a process in which the physical layout from design tape-out is modified to compensate for the pattern distortion caused by optical diffraction, resist development, etch, and other undesirable effects that occur during the lithography process. There are two known approaches to OPC. One is rule-based OPC, in which case correction rules are determined ahead of time, which specify how different geometrical shapes should be modified according to some simple measures associated with the shapes being considered, for example, feature width and spacing. There are predominantly three types of rule-based OPC. One type is hammerhead, that will be applied to line end shapes, as shown in FIG. 1(d), which corrects for line end shortening. Another type is serif, that will be applied to corners, as shown in FIG. 1(e), which corrects for corner rounding. The last type is edge bias, which corrects for line edge displacement, as shown in FIG. 1(f). The bias correction is a more generic form of correction, as more complex corrections can be represented by a collection of individual edge biases. For example, the serif or hammerhead corrections can be viewed as applying individual biases to two or three consecutive edge segments, with corners filled, as illustrated in FIG. 1(g) for the case of a serif. One polygon can contain a multitude of shapes that demand all three types of correction, as demonstrated in the example shown in FIG. 1(b). Rule-based OPC is usually geometry-based, and is simple and fast. However, rule-based OPC is not very accurate, and, hence, is used only for 0.25 µm or larger technology nodes or on non-critical layers of more advanced technology nodes (0.18 μm or smaller), such as metal, or layers that contain only relatively large geometries whose accuracy requirements are more relaxed. Moreover, generation of correction rules is non-systematic and often requires experience, and as the complexity of the geometries increases, the number of rules and possibly complexity of the rules increase as well, which makes them difficult to maintain.

The other OPC approach is model-based OPC. In model-based OPC, a lithography model, which captures the effects of optics and the general layout to the silicon pattern transfer process, is used to simulate the layout patterns and predict the corresponding patterns on the wafer, based on which the required correction to each geometrical shape is calculated and applied. The lithography model consists of a) an optical model and b) other process effects including chemical, etching, and other factors. An optical model typically operates within a finite range called a proximity range. When the optical image is simulated for a location, commonly referred to as an evaluation point, only layout geometries within a radius of the proximity range centered around the evaluation point are considered, and those geometries outside of the range are ignored. A calibrated lithography model incorporates the optical model and the other process effects. To obtain a calibrated model, test masks are illuminated, wafer images are formed, and measurements are made, followed by data fitting. The lithography model is independent of physical layout.

The model-based OPC process typically involves a step referred to as dissection, where polygon edges are broken into edge segments which can be moved individually to correct each segment. Evaluation points are specified on the segments where the models are evaluated to calculate certain wafer characteristics, such as edge displacement, as illustrated in FIG. 1(c). The required edge movement is calculated on-the-fly so that the simulated edge displacements are minimized. Due to the use of a model and a correction algorithm, the correction does not require correction rules a priori, and is usually more accurate than one corrected by a rule-based approach. On the other hand, due to finer granularity of the correction, the resulting corrected layout by a model-based approach is typically more complex than that by a rule-based approach. Accordingly, full model-based OPC is generally used for critical layers of designs of 0.18 μm or smaller.

Because a critical layer may also contain non-critical features for which a rule-based approach would suffice, a hybrid OPC approach is sometimes used that achieves reduction in OPC turnaround time and also simplification of OPC complexity. In such selective hybrid OPC, as disclosed in U.S. Pat. No. 6,584,609, a portion of the layout, typically containing non-critical or large features, is corrected by rule-based OPC, and a different portion of the layout, typically containing critical or small features, is corrected by model-based OPC. The more areas that require rule-based OPC, the faster the turnaround time, and the less complex the output. However, determination of the selection rules, like the determination of the correction rules, is still very much a manual process, and is usually a time-consuming and ad hoc process. Moreover, the accuracy performance of these rules is difficult to quantify a priori. Hence, it is difficult to predict the accuracy of the correction results when they are applied.

Thus, it would be desirable to provide an IC design system and method for generating selection and correction rules for the rule-based OPC in hybrid OPC applications. In particular, a model-based approach that provides systematic pattern characterization and rule generation is needed that also allows quantitative prediction of the corresponding OPC results. It is to this end that the present invention is directed. The various embodiments of the present invention provide many advantages over conventional IC design methods and systems.

SUMMARY OF THE INVENTION

In accordance with the present invention, a system and method are provided to enumerate and analyze a series of layout patterns conforming to a set of design rules through simulation using a lithography model, typically calibrated to empirical data, which would be used in the model-based OPC of integrated circuit (IC) layouts. Such analysis results in a set of selection rules that can be applied to an IC layout to identify portions of the IC layout that can be corrected by rule-based OPC that would otherwise be corrected by model-based OPC, and portions of the IC layout that need to be corrected by model-based OPC. The system and method of the present invention preferably determine whether a correction rule can be found for each pattern according to prespecified performance metrics under different variations of the pattern. Those patterns for which correction rules can be found are deemed suitable for rule-based OPC. Those patterns for which correction rules cannot be found are considered to require model-based OPC. The method and system can optionally generate correction rules together with the selection rules. Additionally, a system and method for OPC of a physical layout are provided that use the generated rules to select layout portions that are rule-correctable, and apply the corresponding correction rules, and correct the remaining layout using model-based OPC, which takes into account the rule-based corrections.

The foregoing and other objects, aspects, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing:

FIG. 1, comprising FIGS. 1(a) through 1(g), illustrates the pattern distortion from the lithography process and application of optical proximity correction (OPC);

FIG. 3, comprising FIGS. 3(a) through 3(d), illustrates an exemplary IC design layout pattern characterized by three geometric dimensions and four possible variations of the pattern;

FIG. 4 compares areas subject to pattern variations (uncertain areas) with and without considering the neighbor width, behind spacing, and vertical clearances and fills;

FIG. 5 is a flow diagram of one implementation of model-based pattern characterization and rule generation for the hybrid OPC method in accordance with a preferred embodiment of the present invention;

FIG. 6 is a flow diagram of an incremental approach for model-based pattern characterization and rule generation in accordance with one embodiment of the present invention;

FIG. 7 illustrates the hybrid OPC flow using the generated pattern selection and correction rules in accordance with one embodiment of the present invention; and FIG. 8 shows several scenarios to which the results from the pattern characterization and rule generation can be applied.

DETAILED DESCRIPTION OF THE PREFERRED EMBODIMENTS

Figure 2:
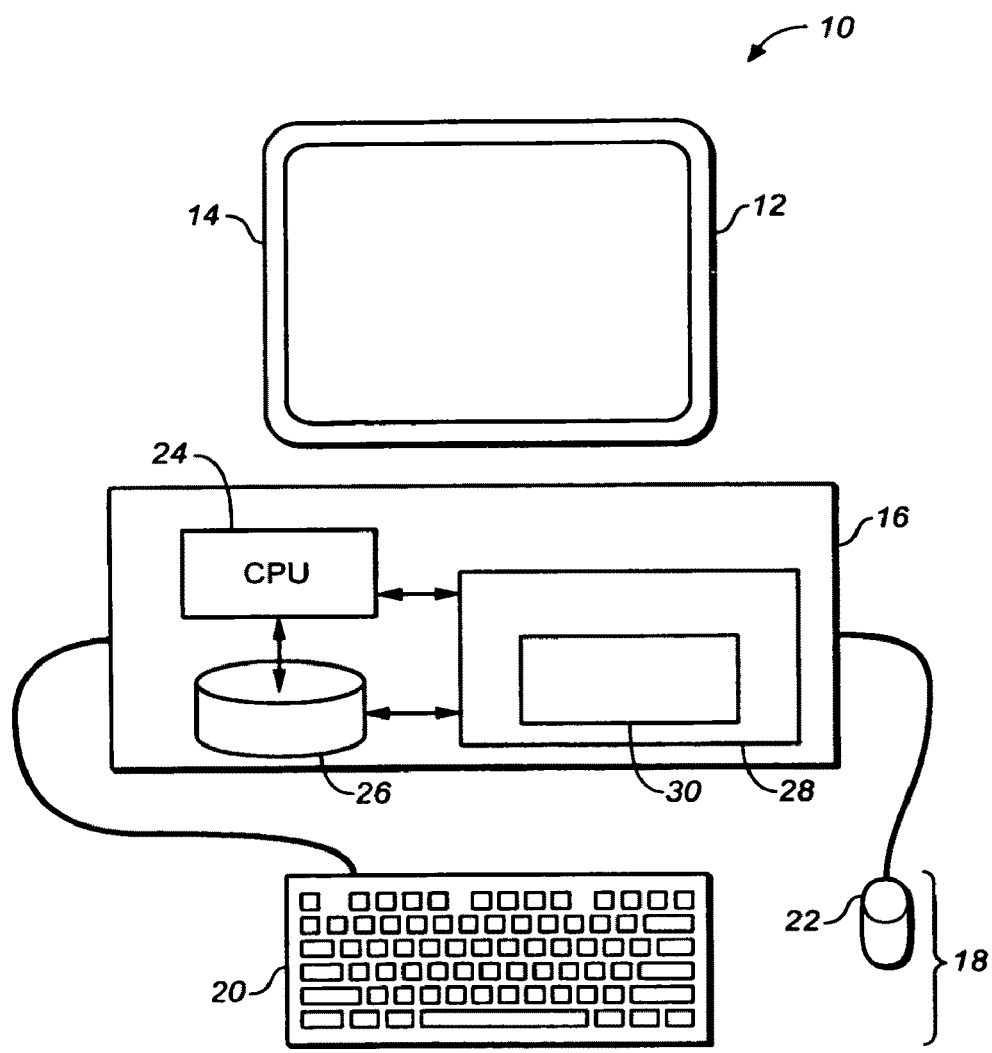
FIG. 2 is a block diagram illustrating an example of an IC design system for providing model-based pattern characterization and rule generation and hybrid OPC in accordance with one embodiment of the present invention.

The present invention is particularly applicable to a computer-implemented software-based IC design system for performing lithography-model-based pattern characterization and rule generation, and producing an IC design by applying hybrid optical proximity correction (OPC) using the generated rules for correcting an IC design layout, and it is in this context that the various embodiments of the present invention will be described. It will be appreciated, however, that the IC design system and method for providing hybrid OPC in accordance with the various embodiments of the present invention have greater utility, since they may be implemented in hardware or may incorporate other modules or functionality not described herein.

FIG. 2 is a block diagram illustrating an example of an IC design system 10 for providing lithography-model-based pattern characterization and rule generation, and hybrid OPC in accordance with one embodiment of the present invention implemented on a personal computer 12. In particular, the personal computer 12 may include a display unit 14, which may be a cathode ray tube (CRT), a liquid crystal display, or the like; a processing unit 16; and one or more input/output devices 18 that permit a user to interact with the software application being executed by the personal computer. In the illustrated example, the input/output devices 18 may include a keyboard 20 and a mouse 22, but may also include other peripheral devices, for example, printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain an IC design tool 30 for providing simulation of lithography models, analysis of IC physical layout patterns, and model- and rule-based OPC. The IC design tool 30 may be implemented as one or more software modules that are executed by the CPU 24.

In accordance with the present invention, the IC design system 10 for providing model-based layout pattern characterization and rule generation and rule-model-based hybrid OPC may also be implemented using hardware and may be implemented on different types of computer systems, such as client/server systems, Web servers, mainframe computers, workstations, and the like. The IC design system 10 can also be implemented in a computer system with more than one CPU and/or a network of computers. Part or all of the software modules can also be realized by hardware such as dedicated integrated circuits. Now, more details of an exemplary implementation of the IC design system 10 in software will be described.

One embodiment of the present invention provides hybrid OPC for an IC design tape-out. For example, the IC design tape-out may be a GDS or OASIS file or a file having another format.

One embodiment of the present invention provides a model-based approach to automatically determine selection rules to identify portions of an IC layout where rule-based OPC can be applied, and correction rules which rule-based OPC uses to apply corrections, based on predefined specifications of one or more performance metrics. For example, the metrics include, but are not limited to, the slope of an image, image contrast, mask error enhancement factor (MEEF), sensitivity to focus variation, sensitivity to aberration, edge placement error (EPE), and critical dimension (CD) of the feature, or any combination of one or more of these and other metrics. In accordance with one embodiment of the present invention, a predefined tolerance specification is preferably used with the performance metric similar to model-based OPC. The tolerance specifies the lower bound and the upper bound on the performance metric. This tolerance data is applied when a pattern is simulated, using a lithography model, for one or more constituent shapes for a set of structurally designed pattern variations. Based on whether or not correction rules can be found which correct the proximity effect of the shapes of the pattern to be within the tolerance specification for all variations, a determination can be made as to whether any of these shapes can be rule-corrected. The pattern variations are preferably obtained by injecting environmental perturbations of the pattern. When a rule is found, the geometrical parameters that characterize the patterns determine the selection rules to find such pattern shapes in a layout, and the corresponding correction rule found to be able to provide correction of the pattern within the tolerance automatically becomes a rule for the rule-based OPC. If a correction rule cannot be found which satisfies the tolerance specification, it is implied that model-based OPC may be required for such pattern shapes. This process identifies not only selection rules, but also determines the correction rules for rule-based OPC itself. In one contemplated modification, instead of testing for existence of a correction rule, one may also be presented with one or more correction rule conjectures which can be tested to determine whether any one or more of these conjectured correction rules is applicable to the pattern shapes which result in all the performance metrics under all pattern variations being within tolerance. This is not only convenient for applying hybrid OPC, but also more efficient and accurate than one would obtain based on simple heuristics. The selection and correction rules may be two separate rule sets or a combined form. In one embodiment of the present invention, the selection rules are implied by the correction rules.

In accordance with one embodiment of the present invention, a correction rule used in rule-based OPC can be represented as a function of multiple variables, $(b_1, b_2, \ldots, c_1, c_2, \ldots) = f(g_1, g_2, \ldots, d_1, d_2, \ldots)$, where $g_i$ are types of shapes such as line edge, line end, corners, gates, contact enclosures, or shapes identified by complex Boolean or geometrical operations across multiple design layers; and $d_i$ are dimensions such as width, spacing, height, enclosure margin, or functions of multiple measured dimensions through a complex formula. The output of the rule consists of one or more bias correction quantities $b_i$, which provide correction to be applied to pattern shapes, together with auxiliary parameters which identify precisely the portion of the shape to which the bias is to be applied. Typically, the shapes are preselected (e.g., an edge or a portion of the edge) such that no further breakdown of the shape is allowed and the rule function simplifies to $(b_1, b_2, \ldots,) = f(g_1, g_2, \ldots, d_1, d_2, \ldots)$. If the shape consists of a single edge segment, then the rule function simplifies to $b = f(g_1, g_2, \ldots, d_1, d_2, \ldots)$, where b is the bias to be applied to the edge segment. This is a generic representation, since as explained in the prior art section, other more complex shapes can be broken down into a collection of single edge segments.

The complete rule set can also be conveniently represented in tabular format. For example, in the case of the edge segment rule formulation $b=f(g_1, g_2, \ldots, d_i, d_2, \ldots)$, each rule with values of $g_1, g_2, \ldots, d_1, d_2, \ldots$ and b constitutes an entry, with $g_1, g_2, \ldots, d_1, d_2, \ldots$, being the columns of "key" to the entry, and b being the "value" column of the entry (as in databases).

FIG. 3(a) shows an embodiment in accordance with the present invention in which the shape under consideration is regular line edges, and the dimension variable consists of three dimensions which are line width, neighbor spacing, and line edge length or feature height. The rule is written as $b=f(e, w, s, h)$, where e stands for line edge; w, s, and h are quantities of the corresponding width, spacing, and height, respectively; and b is the bias value to be applied to such type of line edge corresponding to the given width, neighbor spacing, and height quantities, as shown in FIG. 3(a). This is a typical parameterization of OPC rules where correction is based solely on immediate changes, such as change of width, change of neighbor spacing, and change of height. An example, of a portion of one such rule table is

| Shape | Width (w) | Spacing (s) | Height (h) | Bias (b) |
|---|---|---|---|---|
| Line edge | $600 \leq w \leq 640$ | $700 \leq s \leq 740$ | $1600 \leq h \leq 1680$ | −7 |
| Line edge | $640 \leq w \leq 680$ | $700 \leq s \leq 740$ | $1600 \leq h \leq 1680$ | −7 |
| Line edge | $600 \leq w \leq 640$ | $740 \leq s \leq 780$ | $1600 \leq h \leq 1680$ | −7 |
| Line edge | $640 \leq w \leq 680$ | $740 \leq s \leq 780$ | $1600 \leq h \leq 1680$ | −7 |

Patterns characterized by these parameters are only known within the (w+s)×h area shown in the dashed box in FIG. 3(a). This area is referred to as the "region of sight". Areas outside the region of sight are unknown, and may contain arbitrary geometries. FIGS. 3(b), (c), and (d) are examples of three different pattern variations that have identical geometric patterns within the region of sight, and, hence, are indistinguishable by the pattern characterization based on width, neighbor spacing, and height.

In FIG. 4(a), the shaded area is outside of the region of sight, but still within proximity range such that any geometry in this area will affect the printing of the edge being considered. This area is referred to as the "uncertain area".

When the region of sight is too small, the possible variation in the uncertain area is large. Therefore, it is difficult for a single correction rule to correct the given pattern accurately under all possible variations, for example, in the three cases shown in FIG. 3(b), (c), and (d). This is the main cause of inaccuracy in rule-based OPC.

In accordance with the preferred embodiment of the present invention, possible variations beyond the region of sight (within the uncertain area) are ignored. This means that any such variations must be tolerated with one type of correction, or the pattern is not suitable for rule-based OPC. The variations are generally characterized by two-dimensional effects and long range effects. FIG. 3(b) shows a typical long range effect, in which a geometry 32 behind the main feature 31 is not seen inside the region of sight and which is of significant effect to the printing of the main feature if it is close enough to the edge being considered (typically true when the pattern width is small). Similarly, if FIGS. 3(b) and 3(c) are compared, one can observe that the facing geometry 34, which leads to the same neighbor spacing for the main feature 31, may have different widths, which can lead to a significant effect on the main feature if the spacing is small. FIG. 3(d) shows an example of two-dimensional effects where there are geometries on both the top and bottom of the pattern outside the region of sight, as indicated by numerals 35, 36, and 37, as compared with FIG. 3(a), (b), or (c), which can have a significant effect on the printing of the main feature if the feature height is small. Therefore, a shape of a pattern is potentially suitable for applying rule-based OPC only if these variations beyond the region of sight have limited effect on the printing of the shape, that is, the corresponding feature width, neighbor spacing, and height are relatively large, and a correction amount exists that, after the application of the correction, the changes in the printing of the pattern under such variations are still within a tolerance specification. It is understood that if a correction rule exists for given width, neighbor spacing, and height values or ranges, which causes the performance metric under all possible variations to be within tolerance, then such pattern characterized by these dimensions is suitable for applying rule-based OPC.

In accordance with one embodiment of the present invention, the pattern is simulated on a few discrete evaluation points along the pattern shape, as shown in FIG. 4(a). Simulating on evaluation points is substantially faster than simulating the whole pattern. If selected appropriately, evaluation points are usually sufficiently representative of the behavior of the pattern under the given lithography model. Performance metrics are calculated with respect to these evaluation points using the simulation result and tested to determine whether they are within the tolerance specification(s). This is an approach typically used by model-based OPC.

In accordance with another embodiment of the present invention, to simulate the pattern variations beyond the region of sight, one may add some dramatic perturbations (very large or very small) and evaluate the changes in at least one performance metric such as edge placement error (EPE) or critical dimension (CD) of the pattern shape, based on which the tolerance specification(s) is (are) specified. A correction rule is sought during the process that would minimize the variation of the performance metric to be as closely within the tolerances as possible. FIGS. 3(b) and 3(c) show an example in which the feature behind the main pattern is either zero-sized (non-existent) to be of no effect, or very largely sized as indicated by the numeral 32 to be of significant effect. It is noted that this is an exemplary illustration of perturbations that can be applied beyond the region of sight. In reality, proximity effect is not necessarily proportional to the size of the perturbation. Hence, one may need to consider the lithography model behavior in order to design perturbations that are sufficiently representative of those making the most possible impact on the printing of the pattern shape being considered. One would typically need to use more types of geometry perturbations with different sizes to obtain better statistical coverage of possible variations, and consider the property of the lithography model to find hints of more types of perturbations.

In accordance with one embodiment of the present invention, extra dimensional measures are added such as the width of a neighboring shape ("neighbor width") or spacing behind a main pattern ("behind spacing"), so that it is possible to reduce the amount of variations and, hence, have a higher probability of finding more pattern shapes that are suitable for applying rule-based OPC. FIGS. 4(a) and (b) compare region of sight or the uncertain areas with and without considering the neighbor width and behind spacing. As shown in FIGS. 4(a) and 4(b), the uncertain areas are reduced as the region of sight is expanded by the quantity of known neighbor width and behind spacing. One type of extra dimension that is readily available in the layout conforming to a design rule is the minimum width and spacing, as any legal feature in the physical layout must have a width no smaller than the minimum width, and any legal spacing between two features in the layout must be no smaller than the minimum spacing. In FIG. 4(b), the neighbor width is no smaller than the minimum width, and behind spacing is no smaller than the minimum spacing; both are defined by the design rule.

In accordance with yet another embodiment of the present invention, a vertical clearance or fill areas can be specified to further restrict the possible variations of the pattern. Vertical clearance areas are the areas on the ends of the pattern height (top and/or bottom) in which no feature is known to exist, as indicated by the numeral 40 shown in FIG. 4(c). This is another typical configuration in the physical layout such as in the case of line ends. Vertical fill area, as indicated by the numeral 42 shown in FIG. 4(d), is the opposite of vertical clearance where an area is similarly defined which is known to be filled with features. This type of configuration also frequently appears in physical layouts such as in the case of reverse line ends (sometimes also referred to as space line ends or slot ends, as illustrated in FIG. 1(d)). As a comparison in FIGS. 4(c) and 4(d) shows, specification of vertical clearance or fill areas can further reduce the uncertain areas (notice the reduction of the shaded areas) and the possible variations, hence, increasing the probability of finding correction rules.

Following the same principle, one may add more and more shape or dimension measures to reduce the uncertain area or the uncertainty caused by the possible pattern variations within the uncertain areas. The potential drawback is as more pattern types or dimensions are added to the rule function, the size of the selection or correction rule set may become large and more complex, and the corresponding rule selection or rule-based OPC process may be less efficient. There may be a point at which the rule-based OPC becomes so complex that A is almost equivalent in performance and efficiency to model-based OPC. To fully realize the advantage of rule-based OPC, the rules are preferably as simple as possible.

FIG. 5 shows the flow of applying the model-based pattern characterization and rule generation method in accordance with one embodiment of the present invention. Initially, the variables to use for the rule function are selected, as indicated by a step 101 shown in FIG. 5. As described earlier, a smaller set of variables is preferable to keep the rule set simple and manageable in size. Next, the variable values are enumerated according to the design rule 103 to form intervals for each variable, as indicated by a step 105 shown in FIG. 5. For example, if the design rule specifies minimum feature width of 90 nm and the model has a proximity range of 1 μm, then the width intervals are enumerated using a 20 nm step size as (90,110), (110,130), . . . , (970, 990), (990, 1000) (>1000). Then, as indicated by a step 107 shown in FIG. 5, for each set of variable values and intervals, appropriate test patterns are constructed, as indicated by a step 109 shown in FIG. 5. Also, the region of sight is calculated, and different types of extreme but representative perturbations outside the region of sight are applied, as indicated by a step 111 shown in FIG. 5. Next, as indicated by a step 115 shown in FIG. 5, the printed images are simulated using a lithography model 113 shown in FIG. 5; and the performance metrics are calculated for each of the variations, as indicated by a step 117 shown in FIG. 5. In an ensuing step 119 shown in FIG. 5, a correction is calculated to optimize the performance metrics for all of the variations toward predefined tolerance specifications 121 shown in FIG. 5. Then, as indicated by a step 123 shown in FIG. 5, the correction is applied to each variation of the test pattern, and a re-calculation of the printed image and determination of the performance metrics are performed, which leads to a value of the performance metric associated with the pattern variation. Collecting these values for all of the pattern variations leads to a set of values of the performance metric. If all these performance metric values are within the tolerance specifications, as determined by a step 125 shown in FIG. 5, then the type of pattern is determined to be suitable for rule-based OPC, and the correction rule has also been ascertained and is preferably added to the rule set, as indicated by a step 127 shown in FIG. 5. Otherwise, the type of pattern needs to undergo model-based OPC, as indicated by a step 129 shown in FIG. 5, because no single rule exists that is robust enough to tolerance all variations beyond the region of sight. This process is repeated for all of the rule function variable values and intervals. Thus, the system and method in accordance with the present invention partition the pattern space into one which requires model-based OPC, as indicated by a pattern database 131 shown in FIG. 5, and another which only needs rule-based OPC together with the corresponding correction rules, as indicated by a pattern database 133 shown in FIG. 5, based on the partition by the rule function variable ranges.

Because one can only enumerate a finite and possibly small number of perturbations around each pattern being studied, it is not possible to completely cover all possible variations. To compensate for such "leakage" of unpredictable cases, in accordance with one embodiment of the present invention, it is contemplated that one may first tighten the performance metric tolerance that would normally be considered acceptable to allow more tolerance margin. For example, if CD is used as the performance metric and a tolerance of ±5 nm is given, one may first tighten it by 20% to ±4 nm and then use this ±4 nm as the actual tolerance in qualifying the rules in the patterns studied.

Although tolerance specification is preferred, performance metric specification can be in different forms, as well. For example, the performance metric specification can be a collection of valid values, a collection of non-overlapping intervals (for example, a union of multiple tolerances), or in the case of two or more performance metrics, a formula or a set of formulae that relates the performance metric values.

The method described in conjunction with FIG. 5 tests for the existence of at least one correction rule for each pattern by finding and verifying the correction rule. This way a correction rule is automatically determined for each pattern that is deemed rule-correctable. This method, however, does not exclude other, potentially better correction rules for the rule-correctable patterns. Therefore, it is contemplated that the actual correction rule differs from the one obtained in the described process. Moreover, it is also possible that through other methods, the existence of a correction can be ascertained without actually finding it, in which case the process will only be able to produce selection rules, but not correction rules.

The calculation of performance metrics subject to pattern variations may also be carried out in ways other than adding perturbations outside the region of sight and re-running simulation for each variation. An alternative method is to obtain a more conservative performance metric variation range by studying the mathematical properties of the optical model. For example, consider the following popular optical model formula resulting from the Hopkins formulation of the projection optics imaging system (Reference: Y. C. Pati and T. Kailath, "Phase-shifting masks for microlithography: automated design and mask requirements," J. Opt. Soc. Am. A 11, no. 9 (1994): p. 2438):

$$I(x, y) = \sum_n |G(x, y) \otimes k_n(x, y)|^2$$

$$= \sum_n \left| \int G(x - x_1, y - y_1) k_n(x_1, y_1) dx_1 dy_1 \right|^2$$

where $G(x,y)$ is the transmission function that represents the amplitude and phase of the mask transfer function at location x,y, that satisfies $|G(x,y)| \leq 1$; $k_n(x,y)$ is the so-called $n^{th}$ convolution kernel; and $I(x,y)$ is the intensity at location x,y. The integrals are over the entire two-dimensional space, which can be decomposed into the region of sight and its compliment (the uncertain area). From the linearity of the integrals, it can be deduced that:

$$I(x, y) = \sum_n |E_n(x, y) + F_n(x, y)|^2 \leq$$

$$\sum_n [|E_n(x, y)|^2 + 2|E_n(x, y)||F_n(x, y)| + |F_n(x, y)|^2]$$

$$I(x, y) = \sum_n |E_n(x, y) + F_n(x, y)|^2 \geq$$

$$\sum_n [|E_n(x, y)|^2 - 2|E_n(x, y)||F_n(x, y)| + |F_n(x, y)|^2]$$

where $$E_n(x, y) = \int_{region\ of\ sight} G(x - x_1, y - y_1) k_n(x_1, y_1) dx_1 dy_1$$

$$F_n(x, y) = \int_{uncertain\ area} G(x - x_1, y - y_1) k_n(x_1, y_1) dx_1 dy_1$$

The transmission function $G(x,y)$ inside the region of sight is known (as determined by the layout geometries and the transmission property of the mask) and can be calculated. Consequently, $E_n$ can be calculated. For $F_n$, the following is true:

$$|F_n(x, y)| \leq \int_{uncertain\ area} |k_n(x_1, y_1)| dx_1 dy_1 \stackrel{def}{=} R_n(x, y)$$

where $R(x,y)$ denotes a known quantity because the convolution kernels $k_n(x,y)$ are known from the optical model. Consequently, the following holds true:

$$\sum_n |E_n(x, y)|^2 - 2|E_n(x, y)|R_n(x, y) \leq I(x, y) \leq$$

$$\sum_n |E_n(x, y)|^2 + 2|E_n(x, y)|R_n(x, y) + R_n^2(x, y)$$

which establishes a lower and upper bound of intensity $I(x,y)$. Clearly, these bounds are only meaningful if $R_n(x,y)$ is relatively small compared to $|E_n(x,y)|^2$, which requires the uncertainty area to be small, or the bounds will be too wide to be of any use. Using this range of intensity, one can further deduce the range of EPE, CD, intensity slope, or other performance metric. Similar methods can be applied if a different form of optical model is used. Furthermore, such a method of evaluating intensity bounds can also be substituted into a calibrated lithography model consisting of other effects to obtain the bounds of predicted EPE or CD as well. This way a bound of the performance metric for each pattern can be applied without the use of perturbations. The bound so established, however, is usually very conservative.

In accordance with one embodiment of the present invention, the correction rule is specified in terms of a set of acceptable corrections for a particular pattern as described in the co-pending U.S. patent application entitled CREATING AND APPLYING VARIABLE BIAS RULES IN RULE-BASED OPTICAL PROXIMITY CORRECTION FOR REDUCED COMPLEXITY filed on the same date as the present application, the disclosure of which is hereby incorporated herein in its entirety by this reference. For example, as model-based analysis is performed, it may be discovered that any edge bias amount between 4 nm to 6 nm would have satisfied the performance metric, though 5 nm would have been the best, giving the least amount of discrepancy between the calculated performance metric and the tolerance specification.

In accordance with another embodiment of the present invention, the individually generated rules 133 shown in FIG. 5 are merged prior to being exported for use by rule-based OPC in order to reduce the total number of rules in the rule set. For example, reconsider the rule table described earlier, which is repeated here:

| Shape | Width (w) | Spacing (s) | Height (h) | Bias (b) |
|---|---|---|---|---|
| Line edge | $600 \leq w \leq 640$ | $700 \leq s \leq 740$ | $1600 \leq h \leq 1680$ | −7 |
| Line edge | $640 \leq w \leq 680$ | $700 \leq s \leq 740$ | $1600 \leq h \leq 1680$ | −7 |
| Line edge | $600 \leq w \leq 640$ | $740 \leq s \leq 780$ | $1600 \leq h \leq 1680$ | −7 |
| Line edge | $640 \leq w \leq 680$ | $740 \leq s \leq 780$ | $1600 \leq h \leq 1680$ | −7 |

Observing that each of the four rules has the same bias amount, and the width, neighbor spacing, and height intervals can be unioned to form a larger interval, these rules can be merged into a single rule set as follows:

| Shape | Width (w) | Spacing (s) | Height (h) | Bias (b) |
|---|---|---|---|---|
| Line edge | $600 \leq w \leq 680$ | $700 \leq s \leq 780$ | $1600 \leq h \leq 1680$ | −7 |

The above example shows four different rules with identical bias values that can be merged into one. Alternatively, if the biases of the rules are specified in terms of ranges, as described in the aforementioned co-pending U.S. patent application entitled CREATING AND APPLYING VARIABLE BIAS RULES IN RULE-BASED OPTICAL PROXIMITY CORRECTION FOR REDUCED COMPLEXITY, then rules can be merged if the bias ranges overlap by at least some amount. For example, consider the following rules:

| Shape | Width (w) | Spacing (s) | Height (h) | Bias (b) |
|---|---|---|---|---|
| Line edge | $600 \leq w \leq 640$ | $700 \leq s \leq 740$ | $1600 \leq h \leq 1680$ | $-9 \leq b \leq -5$ |
| Line edge | $640 \leq w \leq 680$ | $700 \leq s \leq 740$ | $1600 \leq h \leq 1680$ | $-8 \leq b \leq -6$ |
| Line edge | $600 \leq w \leq 640$ | $740 \leq s \leq 780$ | $1600 \leq h \leq 1680$ | $-7 \leq b \leq -4$ |
| Line edge | $640 \leq w \leq 680$ | $740 \leq s \leq 780$ | $1600 \leq h \leq 1680$ | $-7 \leq b \leq -3$ |

These rules can be merged into a single rule as follows:

| Shape | Width (w) | Spacing (s) | Height (h) | Bias (b) |
|---|---|---|---|---|
| Line edge | $600 \leq w \leq 680$ | $700 \leq s \leq 780$ | $1600 \leq h \leq 1680$ | $-7 \leq b \leq -6$ |

As all enumerated patterns are analyzed, the patterns are collected into two categories, one that can be selected for rule-based OPC, and one that cannot. When introducing additional rule function variables, such as vertical clearance, and the latter category of patterns is re-analyzed, then it is possible that additional patterns can be identified as correctable by rule-based OPC with slightly more complex rules, because introducing additional variables can increase the region of sight and, hence, reduce variations. This allows one to find more patterns that are rule-correctable in a physical layout. FIG. 6 shows a flow chart for a method in accordance with an embodiment of the present invention in which an incremental analysis is performed where the number of rule function variables is gradually increased. Beginning with a step 501, a minimum number of rule function variables is selected. Next, in a step 502, the values and intervals for each variable are enumerated. Then, in a step 503, an analysis is performed on each enumeration by constructing test patterns, adding perturbations, running simulations, and calculating performance metrics, as earlier described in conjunction with FIG. 5. As a result, a set of rules 504 is generated for a portion of the enumerations. As indicated by a step 506; for the remaining enumerations that are deemed not yet rule-correctable, the analysis is continued by adding an extra rule function variable in a step 505, if it is deemed feasible in a step 507, and the analysis continues. In this fashion, the rule set 504 will continue to grow until there is no new rule function variable that can be added, as determined in the step 507. This allows the simplest rules to be identified first, and then gradually more complex ones are found during iteration of the rule-finding process. When this approach is used, it needs to be kept in mind that the resulting rules may not be of the same format (e.g., complex rules may have more variables in the rule function or more columns for keys in the rule tables than simple rules), and, hence, the rule-matching process using rule-based OPC needs to match the format of the rules.

FIG. 7 is a flow chart of a hybrid OPC method that applies selective rule- and model-based OPC using the selection and correction rules generated by the above pattern characterization and rule generation system. First, in a step 601, an input layout is received. Then, based on the pattern selection rules 606 shown in FIG. 7, the method selects the layout patterns that can be rule corrected in a step 602. Rule-based OPC is applied to these patterns in a step 603, using the corresponding correction rules 606. The remaining patterns that are not selected for rule correction will undergo model-based OPC in a step 604, while considering the rule corrections applied in the step 603 for proximity effects. After all layout patterns are corrected, the final layout is output in a step 605, and the OPC is completed.

In accordance with another embodiment of the present invention, the method of FIG. 7 only performs pattern selection, whereas a different OPC system can be used to apply hybrid OPC to the layout. In yet another embodiment in accordance with the present invention, the method performs the pattern selection and rule-based OPC, whereas a different OPC system performs model-based OPC to the remainder of the layout. It is, however, preferred that at least the pattern selection and rule-based OPC be performed on the same system in the same pass to increase efficiency, since the selection rules and correction rules are usually correlated.

The actual application of the selection and correction rules can also be extended, as illustrated in FIG. 8. In this example, a simple three-dimensional rule based on feature width, neighbor spacing, and height is shown. FIG. 8(a) is the simple scenario where the whole polygon edge has a constant width and neighbor spacing that satisfy the condition and, hence, is biased by the amount $b_0$ specified by the rule. In FIG. 8(b), the edge has varying widths and neighbor spacings where all the present width/spacing pairs satisfy the condition specified by the rule and, hence, the rule is applied. In FIG. 8(c), the edge also has varying widths and neighbor spacings like FIG. 8(b), but there are violations of the width and spacing condition over a small height $h_{32}$ and $h_{33}$, both below a prespecified threshold amount $h_T$. The pattern shape is considered satisfying the rule and, hence, the correction can still be applied. This scenario illustrates how small violations of rule conditions can be handled via a simple thresholding scheme. Different thresholding schemes can be used following the same concept. FIG. 8(d) shows a case where portions of the polygon edges (in this case the portion adjacent to the corners) are excluded for rule matching as they will undergo a different treatment (e.g., corner rule matching or model-based OPC will be applied). FIG. 8(e) illustrates a case where a pattern shape formed by portions of two edges with varying widths and neighbor spacings connected by a small jog is considered in the rule matching. When the rule condition is met for this pattern shape, and the size of the jog $j_5$ is no larger than a prespecified threshold value $j_T$, then the edges constituting the shape are biased by the same amount specified by the correction rule.

The above-mentioned model-based pattern characterization and rule generation system and method, as well as the corresponding hybrid OPC system and method, can be applied to designs that are fabricated by undergoing a simple single exposure-based binary or attenuated phase-shift mask (PSM) process, as well as to more complex manufacturing processes such as using masks with multiple phase regions or multiple masks in a multiple exposure environment.

While the foregoing description has been with reference to particular embodiments of the present invention, it will be appreciated by those skilled in the art that changes to these embodiments may be made without departing from the principles and spirit of the invention. Accordingly, the scope of the present invention can only be ascertained with reference to the appended claims.

What is claimed is:

1. A method to analyze layout patterns, comprising the steps of:
    choosing at least two rule function variables;
    selecting at least one value for each variable;
    constructing at least one test pattern using the selected variable values conforming to a given set of design rules; and
    determining whether each layout pattern is rule-correctable by:
        a) calculating a region of sight based on the variable values;
        b) specifying at least one performance metric specification for at least one shape of the layout pattern for which a suitable correction rule is sought;
        c) calculating a range of possible values for the at least one performance metric induced by uncertainties outside the region of sight by simulating the layout pattern using a lithography model; and
        d) determining whether the at least one shape can be corrected by rule-based optical proximity correction dependent on whether there exists at least one correction rule to the at least one shape such that when the correction rule is applied, the range of possible values of the at least one performance metric is within the at least one performance metric specification.

2. The method of claim 1 wherein the lithography model is a calibrated lithography model suitable for model-based optical proximity correction for the layout pattern.

3. The method of claim 1 wherein the performance metric specification consists of at least one error tolerance used for model-based optical proximity correction.

4. The method of claim 1 wherein the performance metric comprises at least one of the group of performance metrics consisting of the slope of an image, image contrast, mask error enhancement factor, sensitivity to focus variation, sensitivity to aberration, edge placement error, and critical dimension of a main feature including the at least one shape.

5. The method of claim 1 wherein the simulation is performed on at least one evaluation point on the at least one shape.

6. The method of claim 3 wherein the determination step comprises the step of tightening the tolerance specification by a specified amount.

7. The method of claim 1 wherein the at least two rule function variables comprise a feature width and a feature height associated with the at least one shape.

8. The method of claim 7 wherein the at least two rule function variables further comprise a neighbor spacing.

9. The method of claim 7 wherein the at least two rule function variables further comprise at least one of a) a behind spacing, b) a specification of at least one vertical clearance area, and c) a specification of at least one vertical fill area.

10. The method of claim 1 wherein the at least two rule function variables comprise a feature height and a neighbor spacing associated with the at least one shape.

11. The method of claim 10 wherein the at least two rule function variables further comprise at least one of a) a neighbor width, b) at least one vertical clearance area, and c) at least one vertical fill area.

12. The method of claim 1 wherein the step of calculating a range for the at least one performance metric induced by uncertainties outside the region of sight by simulating the layout pattern using the lithography model comprises the steps of:
    adding a plurality of perturbations outside the region of sight to create variations;
    simulating the layout pattern for each perturbation using the lithography model and calculating the at least one performance metric; and
    combining all values of the at least one performance metric to form a range for the at least one performance metric.

13. The method of claim 1, further comprising the steps of:
    selecting layout patterns that are determined not to be rule-correctable;
    adding at least one extra rule function variable, the at least one extra rule function variable being different from the at least two rule function variables;
    selecting one or more values for the extra rule function variable; and
    repeating steps a)-d) for the variable space that is previously considered not to be rule-correctable.

14. The method of claim 13 wherein the at least one extra rule function variable is at least one of a) a feature width associated with the at least one shape, b) a feature height associated with the at least one shape, c) a neighbor spacing, d) a behind spacing, e) a neighbor width, f) a specification of at least one vertical clearance area, and g) a specification of at least one vertical fill area different from the at least two rule function variables and wherein unless one of the at least two rule function variables is a neighbor spacing, the extra rule function variable is not a neighbor width and wherein unless one of the two rule function variables is a feature width, the extra rule function variable is not a behind spacing.

15. The method of claim 1, further comprising the step of generating a correction rule for each layout pattern that is determined to be rule-correctable.

16. The method of claim 15 wherein there is a plurality of correction rules and the rules are merged before they are exported.

17. The method of claim 1, further comprising the steps of:
    receiving an input layout; and
    identifying layout patterns that are rule-correctable using rule-based optical proximity correction.

18. The method of claim 17, further comprising the step of:
    applying correction rules to the selected rule-correctable patterns.

19. The method of claim 18, further comprising the step of:
    applying model-based optical proximity correction to the remainder of the layout to complete the optical proximity correction process.

20. A system for analyzing layout patterns, comprising:
    means for choosing at least two rule function variables;
    means for selecting at least one value for each variable;
    means for constructing at least one test pattern using the selected variable values conforming to a given set of design rules; and
    means for determining whether each layout pattern is rule-correctable, comprising:
        a) means for calculating a region of sight based on the variable values;

b) means for specifying at least one performance metric specification for at least one shape of the layout pattern for which a suitable correction rule is sought;

c) means for calculating a range of possible values for the at least one performance metric induced by uncertainties outside the region of sight by simulating the layout pattern using a lithography model; and d) means for determining whether the at least one shape can be corrected by rule-based optical proximity correction dependent on whether there exists at least one correction rule to the at least one shape such that when the correction rule is applied, the range of possible values of the at least one performance metric is within the at least one performance metric specification.

21. The system of claim 20 wherein the lithography model is a calibrated lithography model suitable for model-based optical proximity correction for the layout pattern.

22. The system of claim 20 wherein the performance metric specification consists of at least one error tolerance used for model-based optical proximity correction.

23. The system of claim 20 wherein the performance metric comprises at least one of the group of performance metrics consisting of the slope of an image, image contrast, mask error enhancement factor, sensitivity to focus variation, sensitivity to aberration, edge placement error, and critical dimension of a main feature including the at least one shape.

24. The system of claim 20 wherein the simulation is performed on at least one evaluation point on the at least one shape.

25. The system of claim 22 wherein the determination means comprises means for tightening the tolerance specification by a specified amount.

26. The system of claim 20 wherein the at least two rule function variables comprise a feature width and a feature height associated with the at least one shape.

27. The system of claim 26 wherein the at least two rule function variables further comprise a neighbor spacing.

28. The system of claim 26 wherein the at least two rule function variables further comprise at least one of a) a behind spacing, b) a specification of at least one vertical clearance area, and c) a specification of at least one vertical fill area.

29. The system of claim 20 wherein the at least two rule function variables comprise a feature height and a neighbor spacing associated with the at least one shape.

30. The system of claim 29 wherein the at least two rule function variables further comprise at least one of a) a neighbor width, b) at least one vertical clearance area, and c) at least one vertical fill area.

31. The system of claim 20 wherein the means for calculating a range for the at least one performance metric induced by uncertainties outside the region of sight by simulating the layout pattern using the lithography model comprises:

means for adding a plurality of perturbations outside the region of sight to create variations;

means for simulating the layout pattern for each perturbation using the lithography model and calculating the at least one performance metric; and means for combining all values of the at least one performance metric to form a range for the at least one performance metric.

32. The system of claim 20, further comprising:

means for selecting layout patterns that are determined not to be rule-correctable;

means for adding at least one extra rule function variable, the at least one extra rule function variable being different from the at least two rule function variables;

means for selecting one or more values for the extra rule function variable; and wherein layout patterns processed by the determination means comprise layout patterns for the variable space that is previously considered not rule-correctable.

33. The system of claim 32 wherein the at least one extra rule function variable is at least one of a) a feature width associated with the at least one shape, b) a feature height associated with the at least one shape, c) a neighbor spacing, d) a behind spacing, e) a neighbor width, f) a specification of at least one vertical clearance area, and g) a specification of at least one vertical fill area different from the at least two rule function variables and wherein unless one of the at least two rule function variables is a neighbor spacing, the extra rule function variable is not a neighbor width and wherein unless one of the two rule function variables is a feature width, the extra rule function variable is not a behind spacing.

34. The system of claim 20, further comprising the step of generating a correction rule for each layout pattern that is determined to be rule-correctable.

35. The system of claim 20 wherein there is a plurality of correction rules and the rules are merged before they are exported.

36. The method of claim 20, further comprising:

means for receiving an input layout; and means for selecting layout patterns that are rule-correctable using rule-based optical proximity correction.

37. The method of claim 36, further comprising:

means for applying correction rules to the selected rule-correctable patterns.

38. The system of claim 37, further comprising:

means for applying model-based optical proximity correction to the remainder of the layout to complete the optical proximity correction process.

* * * * *